United States Patent [19]

Hagiwara et al.

[11] Patent Number: 4,951,120
[45] Date of Patent: Aug. 21, 1990

[54] LEAD FRAME AND SEMICONDUCTOR DEVICE USING THE SAME

[75] Inventors: Yashuhisa Hagiwara, Mitaka; Masachika Masuda, Kodaira, both of Japan

[73] Assignees: Hitachi, Ltd.; Hitachi Microcomputer Engineering Ltd., both of Tokyo, Japan

[21] Appl. No.: 283,842

[22] Filed: Dec. 13, 1988

Related U.S. Application Data

[63] Continuation of Ser. No. 90,552, Aug. 28, 1987, abandoned, which is a continuation of Ser. No. 898,535, Aug. 21, 1986, abandoned.

[30] Foreign Application Priority Data

Oct. 7, 1985 [JP] Japan ................... 60-221832

[51] Int. Cl.⁵ ............ H01L 23/48; H01L 29/44; H01L 29/52
[52] U.S. Cl. .................... 357/70; 357/68; 357/72
[58] Field of Search ............ 357/70, 72, 68; 174/52 FP

[56] References Cited

U.S. PATENT DOCUMENTS 3,842,492 10/1974 Kamerbeek et al. ............ 357/70
4,301,464 11/1981 Otsuki et al. .................... 357/70
4,725,692 2/1988 Ishii et al. ....................... 357/70

FOREIGN PATENT DOCUMENTS 0142554 8/1983 Japan ............................. 357/70
0014448 1/1987 Japan ............................. 357/70
0081738 4/1987 Japan ............................. 357/70

Primary Examiner—Rolf Hille
Assistant Examiner—Hoanganh Le
Attorney, Agent, or Firm—Antonelli, Terry, Stout & Kraus

[57] ABSTRACT

A lead frame according this invention is structured such that the width or the length of the inner leads disposed adjacent to the tab suspending leads is made greater than that of other inner leads, whereby wires can be supported completely upon bonding to the leads and, accordingly, the bonding can be carried out surely and the occurrence of short-circuit of the wires can be prevented. Semiconductor devices of high electric reliability can be provided as a result these technics.

11 Claims, 3 Drawing Sheets

LEAD FRAME AND SEMICONDUCTOR DEVICE USING THE SAME

This is a continuation of application Ser. No. 090,552 filed Aug. 28, 1987, now abandoned which in turn is a continuation of Ser. No. 898,535 filed Aug. 21, 1986, now abandoned.

BACKGROUND OF THE INVENTION

This invention concerns a lead frame and a semiconductor device using the lead frame and, more particularly, it relates to an effective technic capable of improving the reliability and workability for the wire bonding in the production step of a semiconductor device.

As one of the technics for electrical conduction between a pellet and an inner lead, a so-called wire bonding method has been known. In the wire bonding method, the first bonding is at first carried out by heating to melt the top end of a bonding wire made of metal, for example, gold (Au) by means of electrical discharge or hydrogen torch to thereby form a ball at the top end and then pressing the ball portion to the bonding pad electrode of the pellet. Then, the second bonding is carried out by positioning a bonding capillary to a predetermined portion of the inner lead such that the wire forms a loop and pressing the bonding wire to the inner lead. Finally, the remaining portion of the bonding wire is cut out to complete the bonding.

SUMMARY OF THE INVENTION

In the case of a lead frame for use in a flat package type semiconductor device, in which tab suspending leads are arranged at the corners of a tab and in which the inner leads comprise a multiplicity of pins (a plurality of inner leads are disposed), the distance between the inner lead in the vicinity of, i. e., adjacent to, the tab suspending lead (that supports the tab by connecting the same to the frame of the lead frame) and the pad electrode of the pellet is a large distance and, accordingly, the distance of extending the bonding wire is increased. It has been found by the present inventors that this tends to cause slackening to the bonding wire and cause electrical short-circuit between the bonding wire and other inner leads, or between the bonding wire and the tab suspending lead.

Further, in the case where the inner lead disposed adjacent to the tab suspending lead connected to the tab corner in the lead frame has only the same lead width and lead length as those of other inner leads, the bonding wire may sometimes be detached from above the inner lead near the tab suspending lead upon wire bonding. It has also been found by the present inventors that this makes the support of the wire by the second bonding insufficient thereby causing slackening to the wire.

The wire bonding technics are specifically disclosed, for example, in "Integrating Mounting Technics" edited by Japan Microelectronics Associates, published from Kabushiki Kaisha KOGYO CHOSAKAI on Jan. 15, 1980, p 99-103.

An object of this invention is to provide a lead frame capable of preventing the short-circuitting in the wire thereby increasing the reliability upon wire bonding.

Another object of this invention is to provide a semiconductor device having a high electrical reliability.

These and other objects, as well as novel features of this invention will become apparent by the following descriptions of the specification and the appended drawings.

The summary of typical embodiments of the invention disclosed in the present application will be described simply as below.

When a lead frame structure is so adapted that the width or the length of the inner lead disposed adjacent to a tab suspending lead is made greater than those of other inner leads, since the wire is supported completely upon second bonding, the bonding can be conducted surely thereby preventing the occurrence of short-circuit in the wire.

Furthermore, a semiconductor device of high electric reliability can be provided according to the technics described above.

DESCRIPTION OF THE PREFERRED EMBODIMENTS

Example 1

Figure 1:
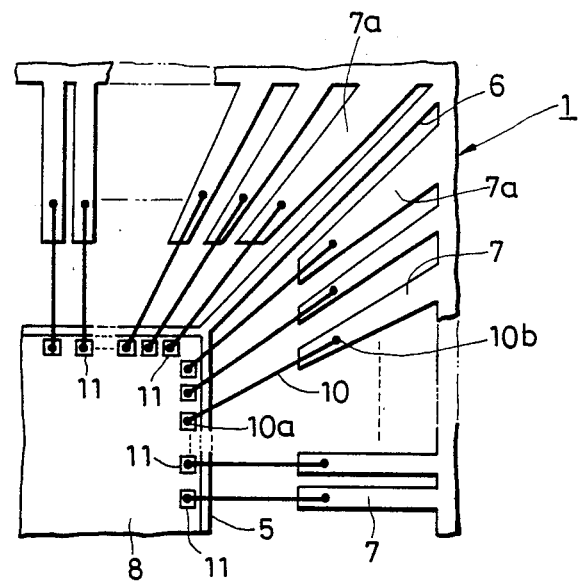
FIG. 1 is an enlarged plan view of a portion of a lead frame, which has been subjected to pellet bonding and wire bonding, according to a first embodiment of this invention.
Figure 2:
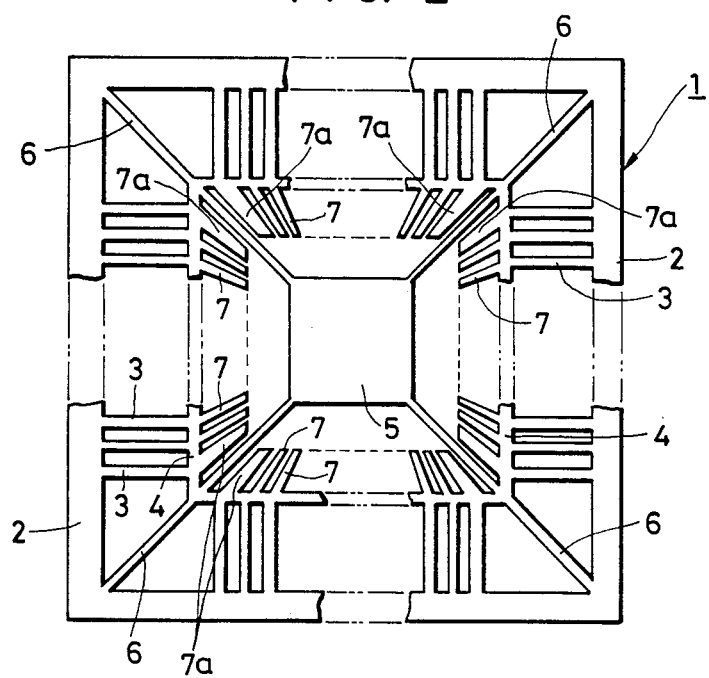
FIG. 2 is a plan view showing the entire lead frame of the first embodiment.
Figure 3:
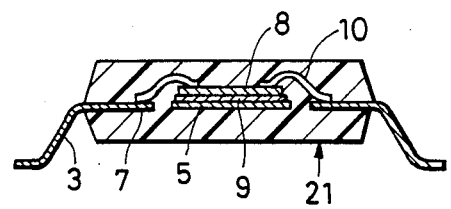
FIG. 3 is a entire cross sectional view showing a semiconductor device using the lead frame of the first embodiment.
Figure 4:
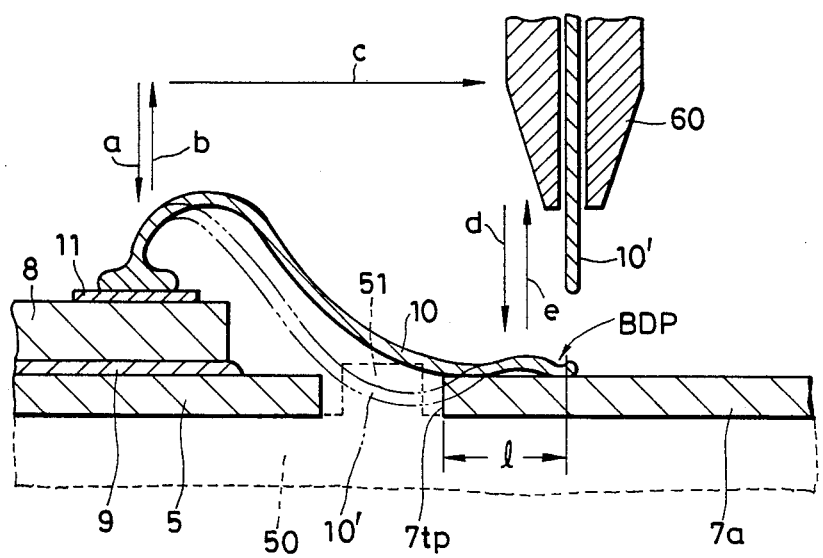
FIG. 4 is a cross sectional view of the lead frame and its periphery upon bonding.

FIG. 1 is a enlarged plan view for a portion of a lead frame according to one embodiment of this invention which has been subjected to pellet bonding and wire bonding. FIG. 2 is a plan view showing the entire structure of the lead frame. FIG. 3 is a cross sectional view showing the semiconductor device using the lead frame and FIG. 4 is a cross sectional view of the lead frame and the peripheral portion thereof upon bonding.

The lead frame 1 of this first embodiment is used in a resin-encapsulated flat package type, a so-called FPP type, semiconductor device 21 as shown in FIG. 3, although it could be used in either types of packages. A plurality of units in the shape shown in FIG. 2 are connected on both the left and right sides of the single unit shown in the drawing.

The lead frame 1 comprises a square frame 2, a plurality of leads 3 extended respectively from each side of the frame 2 to the center and tie bars 4 for connecting the respective leads at their middle portions. A square tab 5 is formed at t he center of the lead frame 1 and the tab 5 is supported by tab suspending leads 6 connecting the four corners of the tab and the four corners of the frame 2 respectively. The portion of the leads 3 surrounded with the bars 4 constitutes inner leads 7, at least the surface at the top end thereof is formed with a not illustrated plating layer made of gold (Au or the like) for favorable bonding. According to this embodiment, the inner leads 7a disposed adjacent to the tab suspending leads 6 have a greater width than that of the other inner leads 7 as shown in FIG. 1.

Such lead frame 1 can be prepared, for example, by fabricating a thin metal plate made of 42-alloy which is an alloy comprising 42% nickel and 58% iron or coval which is an alloy comprising 53% alloy, 28% nickel and 18% cobalt, into a predetermined shape by applying an etching treatment or pressing treatment to the plate.

A pellet 8 made of a silicon semiconductor is at first attached by means of adhesives 9 on the tab 5 of the thus obtained lead frame 1.

The lead frame thus bonded with a pellet is then placed on a bonding stage of a wire bonding device, not illustrated, and wire bonding is carried out in which the bonding pad electrodes 11 of the pellet 8 and the inner leads 7 are bonded by means of fine bonding wires 10 made of gold (Au) or the like. In this wire bonding step, a ball is at first formed by heating to melt one end of the wire 10 by means of electrical discharge or the like. Then, a bonding capillary (wire bonding tool) 60 for supporting the wire is moved over the bonding pad 11 of the semiconductor pellet and then lowered as shown by the allow $a$ in FIG. 4. Thus, the ball portion $10a$ is urged against the pad $10a$ to carry out the first bonding.

Then, the capillary 60 is moved such that the wire 10 forms a loop thereby carrying out the second bonding. That is, the capillary 60 is lifted as shown by the arrow $b$ in FIG. 4 after the first bonding, then displaced horizontally toward the bonding are of the inner lead $7a$ and then lowered as shown by the allow $d$. A pressing force for press contacting the wire 10 under heating to the inner lead $7a$ is applied to the wire 10 and, as a result, wire bonding is carried out. Then, the capillary 60 is lifted as shown by the allow $e$ in FIG. 4. In this case, a wire clamp mechanism, not illustrated, in the wire bonding device is actuated and the wire $10'$ on the side of the capillary 60 is subjected to a tensile stress by the wire clamp mechanism and then sheared as shown in FIG. 4 to thereby complete the bonding for one cycle or wire. Thus, bonding step for one cycle has been completed. All of the required pads 11 and the inner leads 7 are thus connected by repeating the foregoing steps by a predetermined number of cycles.

In this first embodiment, the inner leads $7a$ disposed adjacent to the tab suspending leads 6 are formed with a broader size than other leads 3 as described above. Accordingly, a sufficient width of contact can be secured to the wire 10 which is landed while tracing a loop in the inner lead $7a$ upon the second bonding. Accordingly, sagging of the wire 10 liable to be caused in the wire bonded to the inner lead $7a$ disposed adjacent to the tab suspending lead 6 can effectively be prevented thereby preventing the occurrence of short-circuit in the wire 10.

Figure 5:
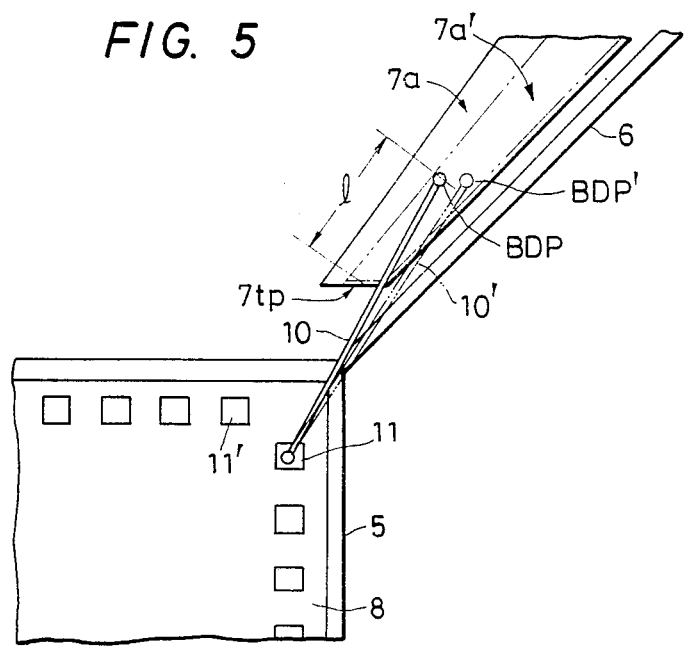
FIG. 5 is a plan view of a lead frame upon bonding and, FIG. 6 is an enlarged plan view of a portion of a lead frame according to a second embodiment of the invention and upon which pellet bonding and wire bonding have taken place.

More specifically, with reference to the prevention of a short circuit in the wire 10, as shown in FIG. 4 and 5 of the drawings, the distance $l$ along the plane portion from the top end $7tp$ of the inner lead $7a$ to the bonding position BDP of the inner lead $7a$ forms a portion effective for preventing undesired deformation in the loop shape of the wire 10. If the width of the inner lead $7a$ adjacent to the tab suspending lead 6 is made broader as in this embodiment, if the position of the pad 11 on the semiconductor pellet 8 to be bonded is somewhat changed, the wire 10 passes on the top end of the inner lead as shown by the solid line in FIG. 5. In this case, the loop of the wire 10 to the side of the lead upon bonding is preferably limited by the portion l. As a result, the wire 10 is substantially located only at the portion above the plane of the lead as shown by the solid line in FIG. 4 thereby causing no undesired short-circuit.

While on the other hand, in the case where the inner lead $7a$ has a narrow width as shown by the dotted chain in FIG. 5, that is, in the case of the conventional lead frame, the wire $10'$ bonded to the inner lead is extended with a deviation from the top end of the inner lead even if the position for the pad 11 is slightly changed as shown by the broken line in FIG. 5. In this case, there is no portion l of the inner lead to prevent the undesired deformation of the loop in the wire $10'$. Consequently, the wire $10'$ may possibly form a loop which extends below the main surface of the lead as shown by the dotted chain in FIG. 4.

Disposition of a protrusion in a space between the top end of the inner lead and the circumferential edge of the tab 5 upon wire bonding is effective for preventing the undesired deformation in the loop of the wire. In FIG. 4, those areas surrounded by the broken line 50 represent a heat block as a work station or as a lead frame table in the wire bonding device. The heat block in this case has a protrusion 51 for the foregoing purpose. The bonding wire for bonding an inner lead which is not adjacent to the tab suspending lead 6 and the pad has a favorable loop shape because of the protrusion presence of the protrusion 51 even if the width of the inner lead is narrow. However, this favorable effect can be expected or the protrusion 51 relative to the wire bonding between the inner lead adjacent to the tab suspending lead 6 and its corresponding the pad by the following reasons.

That is, the positioning of the tab suspending lead 6 relative to the protrusion 51 is difficult due to problems in accurately positioning the lead frame relative to the work station. More specifically, a relatively large space is formed between the protrusion 51 and the tab suspending lead 6 in order that the tab suspending lead 6 does not interfere with the protrusion 51 in the event there is a slight change in the position of the tab suspending lead 6 with respect to the protrusion. As a result, since it is difficult to extend the protrusion 51 to a location between the inner lead $7a$ adjacent to the tab suspending lead 6 and the tab 5, it is impossible to define and form the shape of the wire bonded to the lead $7a$ by the protrusion 51.

As the next step, the lead frame 1 completed with the wire bonding is packaged by encapsulating the tab 5, pellet 8, wires 10, inner leads 7 and tab suspending leads 6 with an epoxy resin 12 by means of a transfer mold method. Each of the leads 3 is then cut and shaped independently to obtain the FPP type semiconductor device 21 shown in FIG. 3.

Example 2

Figure 6:
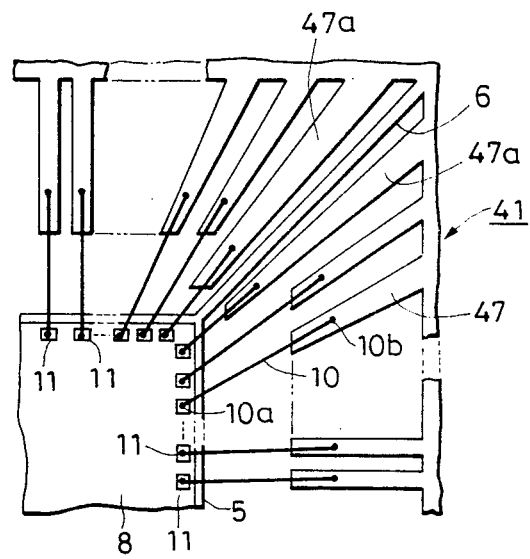

FIG. 6 is an enlarged plan view for a portion of the lead frame as another embodiment of this invention.

The lead frame 41 in the second embodiment is substantially the same as the lead frame 1 described referring to the first embodiment, except that the shape of the inner lead $47a$ disposed adjacent to the tab suspending lead 6 is different.

That is, the inner lead $47a$ disposed adjacent to the tab suspending lead 6 is made axially longer than other inner leads 47 in this lead frame 41, and the top or free end of the lead is extended to a location just near the tab 5. More specifically, the distance between the inner lead 47a and the tab is equal to or less than the distance between the other inner leads and the tab. Thus, the distance or length of the wire 10 used in bonding the inner lead 47a to its adjacent pad 11 can be shortened. Accordingly, the sagging of the wire 10 liable to be caused in the inner lead 47a disposed adjacent to the tab suspending lead 6 can be prevented, by which the short circuit in the wire can be prevented to provide a semiconductor device with a high electric reliability.

This invention has various advantageous effects as set force below:

(1) Since the lead frame is structured such that the inner lead disposed adjacent to the tab suspending lead has a larger wire bonding area than that of other inner leads, a sufficient sliding distance can be ensured upon landing of the wire in the second bonding and, accordingly, the bonding can be conducted surely thereby preventing the short-circuit in the wire.

(2) Since the lead frame is structured such that the inner lead disposed adjacent to the tab suspending lead is made longer than other leads, the length of the loop of the bonding wire can be shortened thereby preventing the short-circuit between the adjacent lead and the bonding wire.

(3) With the reasons (1) and (2) as described above, a semiconductor device with a high electrical reliability can be provided.

(4) Since the sagging of the wire in the inner lead adjacent to the tab suspending lead can be prevented even if the inner lead is made finer, for the reasons (1) and (2) described above, the reliability of the wire bonding can be improved thereby enhancing the high density integration for the semiconductor device.

While the invention accomplished by the present inventors has been described specifically referring to examples, this invention is no way limited to the foregoing embodiments but it can, of course, be varied within a range not departing from the gist of the invention.

For instance, although the shape of the inner lead disposed adjacent to the tab suspending lead has been described only for the case in which the lateral or axial length is increased, the area of the inner lead may be increased in any of the shapes not restricted to those as described above.

Further, although explanation has been made only to the lead frame for use in the FPP type semiconductor device in the above examples, the lead frame maybe used in a so-called plastic leaded chip carrier type semiconductor device in which an external lead is formed as a J-shape.

Furthermore, the bonding method may be a so-called wedge bonding, in which wire is bonded only with the energy of ultrasonic oscillations.

In the case of increasing the width of the inner lead 7a adjacent to the tab suspending lead 6 as in the embodiments, the bondable range relative to the inner lead 7a can be set broader correspondingly. Thus, if the position of the pad electrode to be bonded on the semiconductor pellet is changed, the bonding position of the inner lead 7a can be changed correspondingly, so that the wire can pass above the top end of the inner lead 7a.

However, such an inner lead 7a may be increased in its width substantially only at the top end thereof such as a plane pattern of sector or T-shaped. Also in this case, an undesired shape of the wire loop can be eliminated.

Although the invention accomplished by the present inventors has mainly been described for the case where the invention is applied to a so-called resin-encapsulated type semiconductor device, the invention is in no way restricted thereto but it is also effective when applied to an air-tightly sealed type semiconductor device using low melting glass or the like as the sealing material.

What is claimed is:

1. A semiconductor integrated circuit device comprising a tab having at least three tab suspending leads connected to said tab and extending outwardly therefrom, an integrated circuit chip having a plurality of bonding pads on a first surface thereof, said chip being bonded on said tab at a second surface of said chip, a plurality of leads comprising respective inner lead portions with free ends located in the vicinity of the peripheral side of said tab and outer lead portions, said inner lead portions comprising relatively narrow leads and relatively wide leads which are wide at least at their respective free end portions, the wide leads and the narrow leads being located in substantially the same plane, bonding wires extending between and electrically connecting the inner leads portions at their free ends and said bonding pads, wherein said chip, tab, inner lead portions of said leads and said bonding wires are encapsulated in a material, and wherein said wide leads are located adjacent to said tab suspending leads.

2. The semiconductor device as defined in claim 1, wherein said encapsulation material is a resin.

3. The semiconductor device as defined in claim 1, wherein said encapsulation is an airtight encapsulation.

4. A semiconductor integrated circuit device according to claim 1, wherein the encapsulation material has a plate-like shape and a pair of opposing major surfaces parallel to the plane including the chip, tab, inner lead portions of said leads and said bonding wires.

5. A semiconductor integrated circuit device according to claim 1, wherein all the leads adjacent to each tab suspending lead are wide leads and the others are narrow leads.

6. A semiconductor integrated circuit device according to claim 1, wherein the tab and tab suspending leads are made integrally of a metal sheet.

7. A semiconductor integrated circuit device according to claim 1, wherein the tab suspending leads extend outwardly in at least three different directions substantially orthogonal to each other 8. A semiconductor integrated circuit device according to 1, wherein said tab has a shape which is substantially rectangular and said at least three tab suspending leads extend outwardly from respective corners of the tab.

9. A semiconductor integrated circuit device according to claim 8, wherein four tab suspending leads extend outwardly from the respective four corners of the tab.

10. A semiconductor device as defined in claim 1 or 2, wherein the distance between said relatively wide leads and said tab is equal to or less than the distance between said relatively narrow leads and said tab.

11. A semiconductor integrated circuit device comprising a tab having at least three tab suspending leads connected to said tab and extending outwardly therefrom, an integrated circuit chip having a plurality of bonding pads on a first surface thereof, said chip being bonded on said tab at a second surface of said chip, a plurality of leads comprising respective inner leads portions with free ends located in the vicinity of the peripheral side of said tab and outer lead portions, said inner lead portions comprising relatively narrow leads and relatively wide leads which are wide as compared with the narrow leads at least at the respective free ends, said tab, tab suspending leads and the inner lead portions of said leads being located in substantially the same plane, the free ends of said plurality of leads being coplanar and oriented flat in said same plane, bonding wires extending between and electrically connecting the inner lead portions at their free ends and said bonding pads, wherein said chip, tab, inner lead portions of said leads and said bonding wires are encapsulated in a material, and wherein said wide leads are located adjacent to said tab suspending leads.

* * * * *